US007230439B2

(12) United States Patent
Tan

(10) Patent No.: US 7,230,439 B2
(45) Date of Patent: Jun. 12, 2007

(54) METHOD FOR DETECTING AND MONITORING WAFER PROBING PROCESS INSTABILITY

(75) Inventor: Beng Ghee Tan, Singapore (SG)

(73) Assignee: Systems on Silicon Manufacturing Co. Pte. Ltd., Singapore (SG)

( * ) Notice: Subject to any disclaimer, the term of this patent is extended or adjusted under 35 U.S.C. 154(b) by 5 days.

(21) Appl. No.: 10/542,873

(22) PCT Filed: Feb. 5, 2003

(86) PCT No.: PCT/SG03/00022

§ 371 (c)(1),
(2), (4) Date: Jul. 20, 2005

(87) PCT Pub. No.: WO2004/070399

PCT Pub. Date: Aug. 19, 2004

(65) Prior Publication Data

US 2006/0149505 A1    Jul. 6, 2006

(51) Int. Cl.
  *G01R 31/02*    (2006.01)
(52) U.S. Cl. .................. 324/758; 324/756; 324/757
(58) Field of Classification Search ........ 324/754–762, 324/601, 158.1; 702/81–84, 185
See application file for complete search history.

(56) References Cited

U.S. PATENT DOCUMENTS

| 5,065,092 | A | * | 11/1991 | Sigler | ........................ 324/758 |
| 5,589,765 | A | * | 12/1996 | Ohmart et al. | ........... 324/158.1 |
| 6,043,668 | A | * | 3/2000 | Carney | ....................... 324/758 |
| 6,127,831 | A | * | 10/2000 | Khoury et al. | .............. 324/754 |
| 6,281,694 | B1 | * | 8/2001 | Tsai | ........................... 324/758 |

FOREIGN PATENT DOCUMENTS

JP    05072245 A * 3/1993

* cited by examiner

*Primary Examiner*—Ha Tran Nguyen
*Assistant Examiner*—Roberto Velez
(74) *Attorney, Agent, or Firm*—Harness, Dickey & Pierce, P.L.C.

(57) ABSTRACT

A system and method for detecting and monitoring wafer probe stability including the steps of, probing each die on a wafer, and for each die determining whether the result of the probe is a pass or a fail. If the result of a probe is a fail, re-probing the die and determining whether the re-probe is a pass or a fail. Once all the dies have been probed determining the rate of die re-probes that lead to passes, comparing the rate of passes on re-probes to a pre-determined limit, and if the rate of passes on re-probes is greater than the predetermined limit, assigning the probe status as unstable.

18 Claims, 5 Drawing Sheets s16388.1_06.20021001011407                                                                                    Top

| Device : | TMF105_wr1 | | Tester : | D342X | | |
|---|---|---|---|---|---|---|
| Lot ID : | s16388.1 | Board Num : | 11 | Touchdown : | 1072 | PMU Measure : | 5 |
| Wafer ID : | 06 | Probe Card : | 3 | Indexing : | 987 | Cleaning : | 2 |
| Operator ID : | 1058 | Test Mode : | 0 | Good Die : | 898 | | Recovery : | 3 |
| Timestamp : | 20021001011407 | | | RRR : | 0.33 | | |

| Bin to Bin Recovery | Count | % |
|---|---|---|
| IDD_FAIL(7) -> SCAN_SP_FAIL(16) | 1 | 0.11 |
| BIST_NOM_FAIL(8) -> GOOD(1) | 1 | 0.11 |
| OPEN_FAIL(2) -> GOOD(1) | 1 | 0.11 |
| AMCLK(19) -> GOOD(1) | 1 | 0.11 |
| FAIL -> GOOD | 3 | 0.34 |

| Top 10 CRC Fail Pins | Count | % |
|---|---|---|
| xo(73) | 2 | 40.00 |
| pll0(11) | 2 | 40.00 |
| gclk1(2) | 2 | 40.00 |
| gclk(1) | 2 | 40.00 |

Figure 5

METHOD FOR DETECTING AND MONITORING WAFER PROBING PROCESS INSTABILITY

CROSS-REFERENCE TO RELATED APPLICATION

This application is a National Stage of International Application No. PCT/SG03/00022, filed Feb. 5, 2003, and which is hereby incorporated by reference.

FIELD OF INVENTION

The invention relates to a method for detecting and monitoring wafer probing process instability through use of immediate re-probing and immediate re-probe data.

BACKGROUND

In wafer manufacture probing is a process for testing if dies formed on a wafer are functional. Probing dies on a wafer involves penetrating the surface of the wafer at predetermined points to make contact with the pads of each die. The probe uses probe needles to make contact with the pads of each die. Once the probe has penetrated the surface of the die an electronic signal is passed through the die from at least one probe needle to at least one other probe needle. Information received from the probe needle(s) is used to determine the functionality of the die.

Problems may arise in the probing process due to a number of different reasons. These reasons include dirt being trapped on the probing needles, surface residue building up on the probing needles, and the probing needles becoming bent out of shape.

At present an operator reviews the probe results and judges whether there is a probing issue by visual inspection of failed wafer results or low yield of certain results. For example the operator may suspect that there is a probing issue as the number of failed dies per wafer gradually increases. The disadvantage of the present method is that probing problems usually begin long before they are detected by the operator. This leads to the probing failure of potentially large numbers of dies that are good dies.

SUMMARY OF INVENTION

It is the object of the invention to provide an improved method for assessing probe stability or to at least provide the public with a useful choice.

In broad terms in one aspect the invention comprises a method for detecting and monitoring wafer probe stability including the steps of:
  Probing each die on a wafer;
  For each die determining whether the result of the probe is a pass or a fail;
  if the result of a probe is a fail, re-probing the die and determining whether the re-probe is a pass or a fail;
  once all dies have been probed determining the rate of die re-probes that lead to passes;
  comparing the rate of passes on re-probes to a pre-determined limit; and
  if the rate of passes on re-probes is greater than the predetermined limit, assigning the probe status as unstable.

Preferably the step of assigning the probe status as unstable includes setting a flag on the monitoring device. The step of assigning the probe status as unstable may further include sounding an alarm and/or providing an indicator on a monitor. The step of assigning the probe status as unstable may further include disabling the probe equipment.

Preferably the step of re-probing any die that fails on the first probe is performed a predetermined number of times. In one embodiment the re-probing is performed only once for each die that fails on the first probe. In alternative embodiments the step of re-probing may be performed more than once.

Preferably the method further includes creating a probe reference file for each wafer.

Preferably the probe reference file contains a re-probe limit, re-probe recovery rate information, a bin re-probe limit, a sensitivity limit and the recovery rate for re-probing.

Preferably the re-probe recovery rate information includes a limit value. In one embodiment for wafers with more than a few hundred dies the limit may be 2%. In other embodiments a limit may be set as three times the standard deviation of the re-probe recovery rate from previously supplied data.

Preferably the sensitivity limit includes data on the number of sensitive dies expected in a wafer.

Preferably the recovery rate for re-probing is determined as:

$$\frac{(\text{number of recovery from fail to good} - \text{recovery from sensitivity limit to good})}{(\text{total number of tested good die})}$$

Preferably the method further includes the step of generating a report from the probe reference file for each completed wafer test.

Preferably the report includes device identification information and fail to good probe information.

In broad terms in another aspect the invention comprises a system for detecting and monitoring wafer probe stability including the system arranged to:
  probe each die on a wafer;
  for each die determine whether the result of the probe is a pass or a fail;
  if the result of a probe is a fail, re-probe the die and determine whether the re-probe is a pass or a fail;
  once all the dies have been probed determine the rate of die re-probes that lead to passes;
  compare the rate of passes on re-probes to a pre-determined limit; and
  if the rate of passes on re-probes is greater than the predetermined limit, assign the probe status as unstable.

BRIEF DESCRIPTION OF DRAWINGS

The invention including a preferred form thereof is described with reference to the accompanying drawings and without intending to be limiting, wherein;

FIG. 5 shows an example of a probing report.

DETAILED DESCRIPTION

Figure 1:
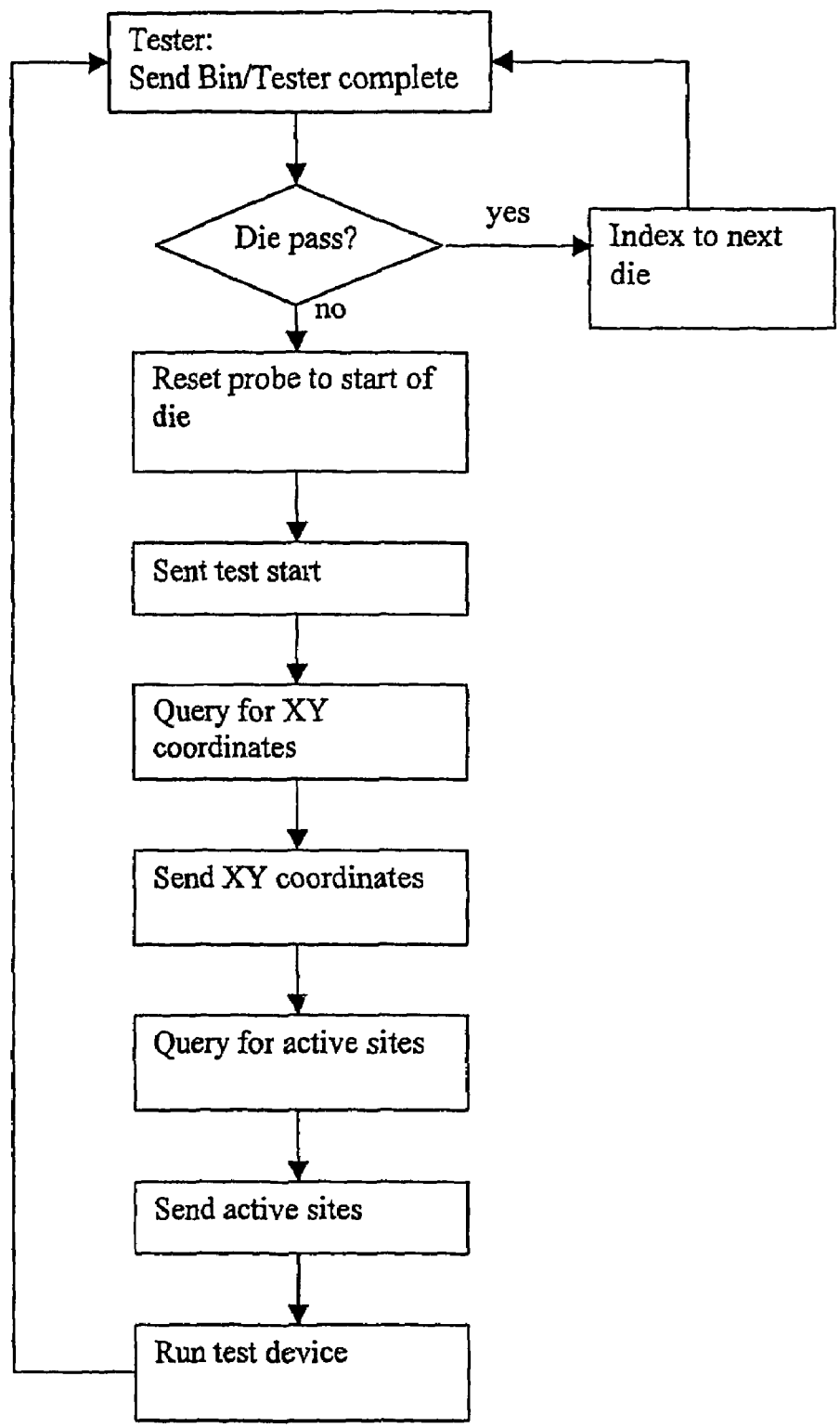
FIG. 1 shows communication between a tester module and a probe that probes the wafer.

FIG. 1 shows the communication between the tester module and the probe. The tester module is arranged to control the probe and the probing process. Initially the probe tests the first die on the wafer. The results are passed to the tester module as shown at the top of FIG. 1. The tester module evaluates the results from the probe.

If the result is a pass then the tester module instructs the probe to test the next die in the wafer. The tester module may also record that the die passed the probe.

If the result if a fail the tester moves into the else part of the IF statement shown in FIG. 1 and instructs the probe to immediately re-probe the die. The probe restarts the probe and sends the results to the tester module as shown at the bottom of FIG. 1. If the result is a pass then the tester module instructs the probe to move onto the next die in the wafer. If the result is a fail the tester module may either be set up to instruct the probe to again re-probe the die or the tester module may be set up to instruct the probe to probe the next die. In either case the tester module records the result of each test on the die.

As will be described further below with reference to FIG. 2 the tester module is set up to instruct the probe to perform a predetermined number of re-probes on any die that fails the initial probe.

As described above when a die fails the initial probe a re-probe is immediately undertaken on the die. This has the advantage that the die will be re-probed when it is still warm, which provices a better testing environment for the die. The immediate re-probing has a very low probe indexing time, which saves time in the re-probe as opposed to re-probing all dies that fail the initial probe after the whole wafer has been probed. Another advantage of the immediate re-probe is that on the re-probe as the probe holes have already been formed the probe can penetrate further into the wafer and establish better contact with the pads of the die.

Figure 2:
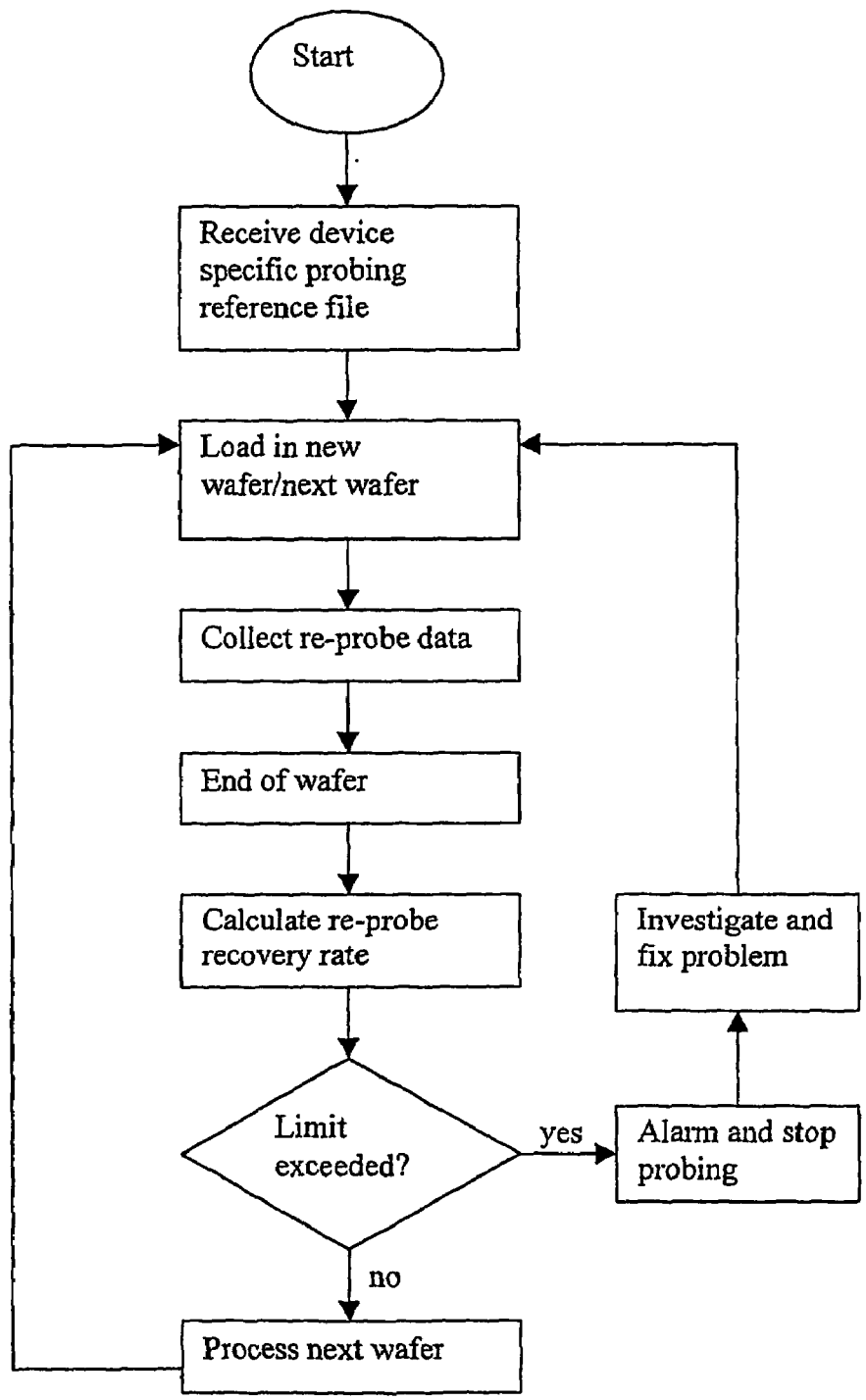
FIG. 2 is a flow chart showing the production process flow.

FIG. 2 is a flow chart showing the production process for probing a wafer. Each wafer or type of wafer has a probing reference file. The reference file may contain information about the wafer such as the type of wafer, the number of dies in the wafer, the spacing of the dies in the wafer, the needle configuration required to test each die in the wafer and the probe results expected in a good wafer. The probe reference file may also contain information on the allowable number of re-probes if the initial probe of a die produces a fail result, the re-probe recovery rate limit, and the expected number of sensitive bins in the wafer.

Once the reference file has been read by the tester module, the next wafer is loaded into the probe device and is probed by the probe as described above with reference to FIG. 1. In the next step, during the probing, the tester module collects the re-probe data. Once the probe has probed all dies in the wafer the re-probe recovery rate is calculated for the wafer.

In the final step shown in FIG. 2 the re-probe recovery rate is assessed to determine whether it exceeds the re-probe recovery rate limit as provided in the probing reference file. If the re-probe recovery rate is lower than the re-probe recovery rate limit the probing on the wafer is considered complete and the new wafer may be loaded into the probe module so that the testing process may continue.

If the re-probe recovery rate exceeds the re-probe recovery rate limit an alarm is set and an operator is notified. The operator can then investigate the cause of the high re-probe recovery rate and fix any problems found. Potential problems with the probe include the probe mark overdrive setting not being optimized, probe mark drift, a bad or dirty probe card.

The probing reference file may reside in a central server. The probing reference file contains various predetermined limits for the probing process. These limits include the re-probe limit, the re-probe recovery rate limit, the bin re-probe limit and the sensitive bin.

The re-probe limit is a global setting for the allowed number of re-probes before the probe is instructed to continue probing the next die. For example, if the re-probe limit is set to 1, then only one re-probe will be done for any die that fails the initial probe. Generally setting the re-probe limit to 1 is sufficient.

The re-probe recovery rate limit can be set from experimental results and can be set as a percentage. In a production test the re-probe recovery rate can be determined by the following formula:

$$\frac{\text{(number of recovery from fail to good)}}{\text{(total number of tested good die)}}$$

Figure 3:
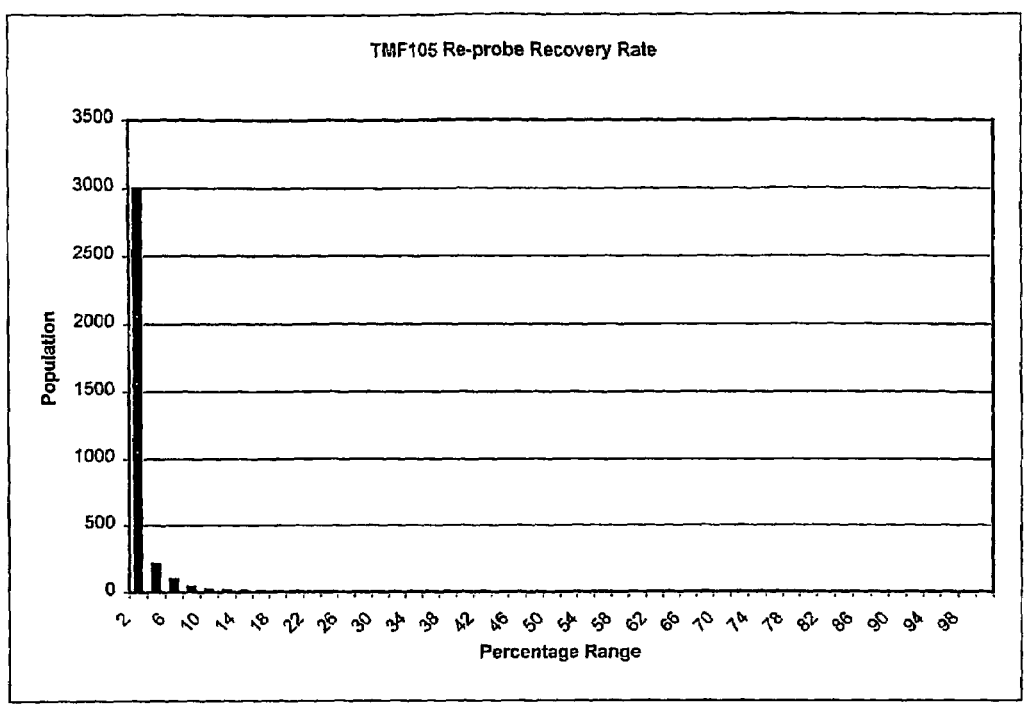
FIG. 3 shows indicative re-probe recovery rates for a particular wafer.

This number can be expressed as a percentage. Usually data generated by production tests are skewed as shown in FIG. 3. This Figure shows that the re-probe recovery rate is generally small. A re-probe recovery rate limit can be determined from this data.

For many wafers with more than a few hundred dies a re-probe recovery rate limit of about 2% is often sufficient. For a wafer with fewer dies or for a wafer that is still undergoing improvement in probing tests (i.e. a sufficient re-probe recovery rate limit has not yet been determined) a statistical process control approach of three times the standard deviation of the collected re-probe rate data may be used.

The re-probe recovery rate limit provides a limit to the percentage or amount of re-probes that change the test status from an initial fail to a pass before an alarm is issued. If the limit is set too low an operator may be warned that the probe needs to be checked often and when there is nothing wrong with the probe. If the limit is set too high the operator may not be warned often enough and serious probe problems may go unnoticed leading to unnecessarily failed die.

The bin re-probe limit is the same as the re-probe limit but is specific for the type of wafer under test. If this limit is set it over-rides the re-probe limit. If this limit is not set the re-probe limit is used to determine the number of re-probes that will be performed on a die that fails the initial probe.

Some wafers may produce fail results on an initial probe test that are unrelated to any probe conditions and are related to the wafer under test. These initial fail results need to be discounted from the test results and the re-probe results as they are unrelated to probe conditions. If a wafer is known to have dies that are sensitive to probing and may initially fail this is taken into account in the sensitive bin variable. In this way these results can be discounted from the number of re-probe passes to reflect the actual rate of recovery of dies due to any probing issue.

The final formula to determine the re-probe recovery rate is:

$$\frac{(\text{number of recovery from fail to good} - \text{recovery from sensitive bin to good})}{(\text{total number of tested good die})}$$

If this rate exceeds the re-probe recovery rate limit an alarm will be activated and an operator notified. If the rate is lower than the re-probe recovery rate limit the next wafer will proceed to the testing process.

Figure 4:
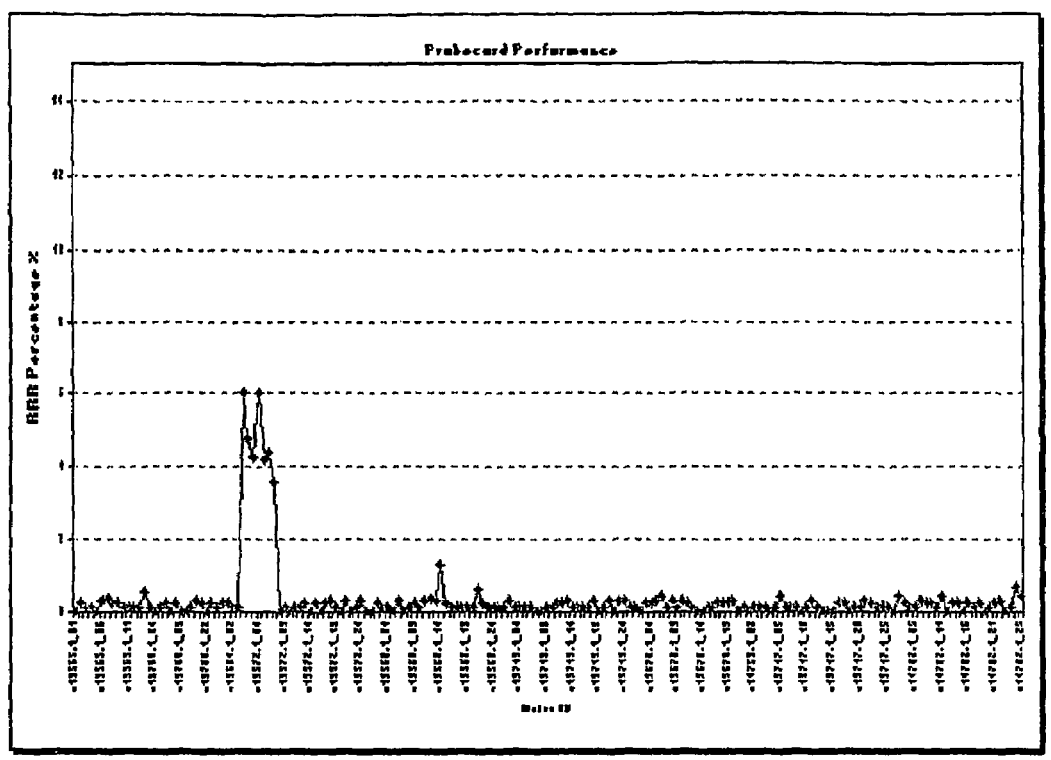
FIG. 4 shows the performance of a probe over a number of wafers.

FIG. 4 shows an example of probe card performance for a number of tested wafers. The wafers under test are shown along the horizontal axis of the graph and the probe performance as a function of the percentage re-probe is shown on the vertical axis. As can be seen the probe card performance is generally good and has generally produced a re-probe percentage less than the nominal 2% suggested above. However it can be seen that for a number of cards, each tested one after the other, the re-probe rate is higher than expected. This suggests a problem with the probe when testing these cards.

In general the tester will generate a report upon the completion of each wafer test. In one embodiment the report shows some basic information about the tested wafer and also information on other probing projects. The report may also be arranged to show information on other probing projects. A sample report is shown in FIG. 5. The information in the bottom left hand corner is probing information. The bottom line of this report shows the re-probe recovery percentage for the wafer under test. In this example the re-probe recovery percentage is 0.34%, which is generally an acceptable level.

The foregoing describes the invention including a preferred form thereof. Alterations and modifications are intended to be incorporated within the scope hereof as defined by the accompanying claims.

The invention claimed is:

1. A method for detecting and monitoring wafer probe stability including the steps of: probing each die on a wafer; for each die determining whether the result of the probe is a pass or a fail; if the result of a probe is a fail, re-probing the die and determining whether the re-probe is a pass or a fail; once all the dies have been probed determining the rate of die re-probes that lead to passes; comparing the rate of passes on re-probes to a pre-determined limit; if the rate of passes on re-probes is greater than the predetermined limit, assigning the probe status as unstable; and reporting the unstable probe status to another device.

2. A method for detecting and monitoring wafer probe stability as claimed in claim 1 wherein the step of reporting the probe status as unstable includes setting a flag on the monitoring device.

3. A method for detecting and monitoring wafer probe stability as claimed in claim 2 wherein the step of reporting the probe status as unstable further includes sounding an alarm and/or providing an indicator on a monitor.

4. A method for detecting and monitoring wafer probe stability as claimed in claim 2 wherein the step of assigning the probe status to unstable further includes disabling the probe equipment.

5. A method for detecting and monitoring wafer probe stability as claimed in claim 3 wherein the step of assigning the probe status to unstable further includes disabling the probe equipment.

6. A method for detecting and monitoring wafer probe stability as claimed in claim 1 wherein the step of re-probing any die that fails on the first probe is preformed a predetermined number of times.

7. A method for detecting and monitoring wafer probe stability as claimed in claim 6 wherein re-probing is preformed only once for each die that fails on the first probe.

8. A method for detecting and monitoring wafer probe stability as claimed in claim 6 wherein the step of re-probing may be performed more than once.

9. A method for detecting and monitoring wafer probe stability as claimed in claim 1 further including the step of creating a probe reference file for each wafer.

10. A method for detecting and monitoring wafer probe stability as claimed in claim 9 wherein the probe reference file contains a re-probe limit, re-probe recovery rate information, a bin re-probe limit, a sensitivity limit and the recovery rate for re-probing.

11. A method for detecting and monitoring wafer probe stability as claimed in claim 10 wherein the re-probe recovery rate information includes a limit value.

12. A method for detecting and monitoring wafer probe stability as claimed in claim 11 wherein for wafers with more than a few hundred dice the limit is 2%.

13. A method for detecting and monitoring wafer probe stability as claimed in claim 11 wherein the re-probe rate recovery limit is set as three times the standard deviation of the re-probe recovery rate from previously supplied data.

14. A method for detecting and monitoring wafer probe stability as claimed in claim 10 wherein the sensitivity limit includes data on the number of sensitive dies expected in a wafer.

15. A method for detecting and monitoring wafer probe stability as claimed in claim 10 wherein the recovery rate for re-probing is determined as:

$$\frac{(\text{number of recover from fail to good} - \text{recovery from sensitivity limit to good})}{(\text{total number of tested good die})}.$$

16. A method for detecting and monitoring wafer probe stability as claimed in claim 9 wherein the method further includes the step of generating a report from the probe reference file for each completed wafer test.

17. A method for detecting and monitoring wafer probe stability as claimed in claim 16 wherein the report includes device identification information and fail to good probe information.

18. A system for detecting and monitoring wafer probe stability comprising:
   means for probing each die on a wafer;
   means for determining whether the result of the probe is a pass or a fail for each die;
   means for re-probing the die if the result of a probe is a fail and means for determining whether the re-probe is a pass or a fail;
   means for determining the rate of die re-probes that lead to passes once all the dies have been probed;
   means for comparing the rate of passes on re-probes to a pre-determined limit; and
   means for assigning the probe status as unstable if the rate of passes on re-probes is greater than the predetermined limit.

* * * * *